US005495129A

United States Patent [19]

Schou et al.

[11] Patent Number: 5,495,129
[45] Date of Patent: Feb. 27, 1996

[54] ELECTRONIC DEVICE FOR MULTIPLEXING SEVERAL LOADS EXCITED BY ALTERNATING CURRENT

[75] Inventors: Guy Schou, Le Bouscat; Gérard Voisin, Trappes; Jean-René Verbeque, Lardy, all of France

[73] Assignee: Sextant Avionique, Meudon La Foret, France

[21] Appl. No.: 244,893

[22] PCT Filed: Dec. 21, 1992

[86] PCT No.: PCT/FR92/01214

§ 371 Date: Jun. 21, 1994

§ 102(e) Date: Jun. 21, 1994

[87] PCT Pub. No.: WO93/13435

PCT Pub. Date: Jul. 8, 1993

[30] Foreign Application Priority Data

Dec. 23, 1991 [FR] France ..................................... 91 16039

[51] Int. Cl.$^6$ ...................................................... H02J 3/14
[52] U.S. Cl. ............................ 307/17; 342/386; 342/448; 342/460; 307/104
[58] Field of Search ...................... 307/17, 104; 342/448, 342/386, 460

[56] References Cited

U.S. PATENT DOCUMENTS

| 4,346,384 | 8/1982 | Raab ........................................ 343/112 |
| 4,364,043 | 12/1982 | Cole et al. ........................... 340/825.54 |
| 4,742,356 | 5/1988 | Kuipers ................................. 342/448 |
| 5,422,519 | 6/1995 | Russel .................................... 307/104 |

Primary Examiner—William M. Shoop, Jr.
Assistant Examiner—Albert Paladini
Attorney, Agent, or Firm—Oblon, Spivak, McClelland, Maier & Neustadt

[57] ABSTRACT

An electronic device for multiplexing several loads to the terminals of a source of alternating electrical energy. The source(4) of alternating electrical energy is coupled by electromagnetic flux to the loads by using primary excitation windings 71, 81 and 91 connect to the terminals of the source (4) of alternating electrical energy and secondary windings respectively corresponding to the number of loads. The secondary windings are at least partially coupled to the primary winding and are each connected to the terminals of a load. The coupling is inhibited by auxiliary winding 73 which are each totally coupled with the secondary winding 72. The inhibition function is controlled in order to inhibit all the magnetic couplings except for one and this particular one changes as a function of the respective load to be coupled to the source 4 of alternating electrical energy.

13 Claims, 3 Drawing Sheets

ELECTRONIC DEVICE FOR MULTIPLEXING SEVERAL LOADS EXCITED BY ALTERNATING CURRENT

BACKGROUND OF THE INVENTION

1. Field of the Invention

The present invention relates to the sequential excitation of several loads with the aid of an alternating current.

2. Discussion of the Background

This problem is posed especially in the electromagnetic systems for locating the position and orientation of an object at short range, such as those systems used for locating the position and the orientation of a helmet worn by a pilot, with respect to a three-axis reference system related to the pilot's cockpit, so as to allow the operation of certain instruments with the aid of the movements of the head pilot while leaving him complete freedom of movement.

One way, by an electromagnetic route, of locating the position and the orientation of an object, at short range, consists in sending at one reference point, successively along the three axes of an absolute three-axis reference system, electromagnetic fields at low frequency of the order of 10 KHz, in measuring, along the three axes of a relative three-axis reference system related to the object whose position and orientation it is desired to know, the components received from the successive electromagnetic fields sent along the three axes of the absolute three-axis reference system, and in deducing, from these measurements and from a preliminary cartography, the position and orientation of the relative three-axis reference system and hence of the object with respect to the absolute three-axis reference system. This way of doing it functions all the better when it is possible to generate successive electromagnetic fields in the precise directions of the three axes of the absolute three-axis reference system, that is to say when the successive emissions of these three electromagnetic fields are capable of being well decoupled.

The successive sending of these three electromagnetic fields is done with the aid of a triple antenna placed at the reference point and shaped into a cube with faces parallel to those of the absolute three-axis reference system. This triple antenna consists of three double orthogonal windings each arranged along two parallel faces of the cube and dimensioned so as to generate, for the same excitation current, the same electromagnetic field intensity outside the cube. Reception is done with the aid of a triple antenna of the same type carried by the object whose position and orientation it is desired to know, and shaped into a cube whose faces are parallel to those of the relative three-axis reference system.

The triple sending antenna constitutes, for the sender, a triple inductive load having a certain number of specific features.

Its three double windings, when they have the excitation current passing through them, develop, at their terminals, a high voltage which reaches about a hundred volts, pushing up the cost of the transistor multiplexer in the case where the transistors would have to withstand this voltage directly.

Moreover, these three double windings are not identical by reason of the constraints on coil forming along the faces of a cube, and exhibit different impedances which does not make it easy to maintain the same excitation current strength.

Moreover, these three windings are coupled by mutual inductance which promotes leakage currents.

SUMMARY OF THE INVENTION

The object of the present invention is to combat the above mentioned difficulties so as to carry out, in a simple way and at low cost, a multiplexing which is adapted to the specific features of a triple sending antenna of an electromagnetic system for locating the position and the orientation of an object at short range.

Its subject is an electronic device for multi-plexing loads to the terminals of a source of alternating electrical energy, including:

means for coupling the source of alternating electrical energy by electromagnetic flux to the loads including at least one primary excitation winding connected to the terminals of the source of alternating electrical energy, and secondary windings, equal in number to that of the loads, at least partially coupled to the primary excitation winding and each connected to the terminals of a load;

means of inhibiting the means of coupling by electromagnetic flux including auxiliary windings, equal in number to that of the loads, each totally coupled with one of the secondary windings; and means for control of the inhibition means imposing the inhibition of all the magnetic couplings except one, which changes depending on the load to be connected to the source of alternating electrical energy.

The means of coupling by electromagnetic flux may include one or more primary excitation windings. When the primary excitation winding is a single one, it is partially coupled to the various secondary windings within a single transformer having a magnetic circuit with several parallel legs, a first leg around which is wound the primary excitation winding and other legs around each of which are wound both a secondary winding and an auxiliary winding of the inhibition means. When the means of coupling by electromagnetic flux include several primary excitation windings, the latter are equal in number to that of the loads, connected in series to the terminals of the source of alternating electrical energy and each totally coupled with a secondary winding within an individual transformer which also includes an auxiliary winding of the inhibition means.

The inhibition of the coupling by electromagnetic flux is obtained in the case of several primary excitation windings with separate transformers either by short-circuiting the auxiliary windings or by making a direct current pass through them, giving rise to saturation.

Advantageously, the electronic multiplexing device further includes isolating switch means equal in number to that of the loads each interposed in series between a load and the secondary winding to which it is connected, the control means imposing a closed state on the isolating switch means arranged in series with the load whose coupling by electromagnetic flux with the source of alternating electronic energy is not inhibited and an open state on all the other isolating switch means.

BRIEF DESCRIPTION OF THE DRAWINGS

Other characteristics and advantages of the invention will emerge from the following description of an embodiment given by way of example. This description will be given with regard to the drawing in which.

DETAILED DESCRIPTION OF THE PREFERRED EMBODIMENTS

Figure 1:
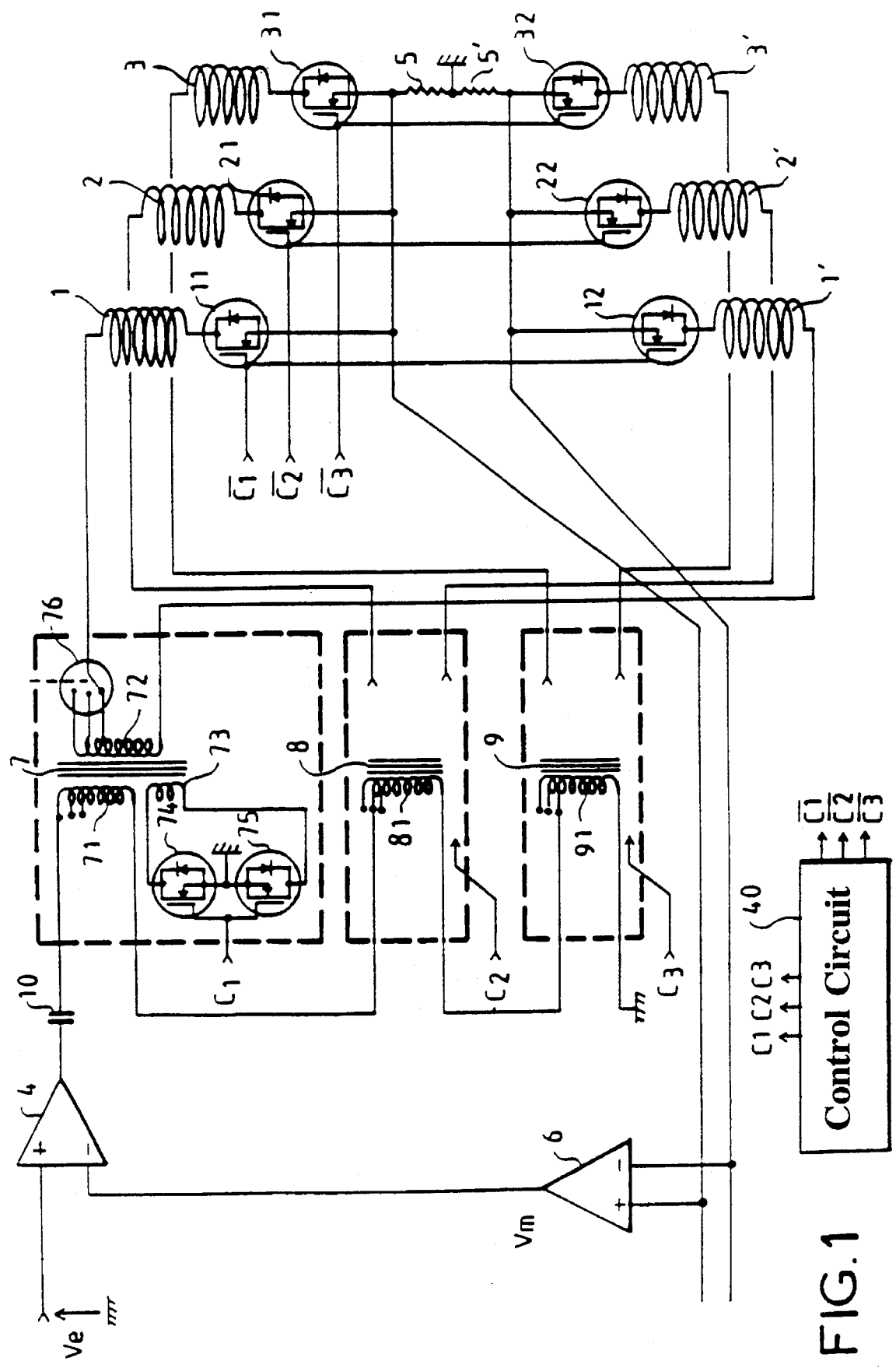
FIG. 1 represents the electrical diagram of a circuit for excitation of the double windings of a triple sending antenna of an electromagnetic locating system including an electronic multiplexing device according to the invention provided with means of coupling by electromagnetic flux incorporating several transformers.

In FIG. 1 can be seen the two parts 1, 1', 2, 2', and 3, 3', of the three double windings of a triple sending antenna of an electromagnetic system for locating the position and orientation of an object, at short range. These double windings are, as mentioned previously, arranged in orthogonal planes. They are intended, on the one hand, to be excited successively by an alternating current of the same intensity, with a frequency of the order of about 10 kilohertz, although they do not present exactly the same impedance, and, on the other hand, when they are not excited, to have residual currents which are as weak as possible passing through them.

The alternating excitation current is delivered sequentially to the double windings of the triple antenna, by means of a multiplexer according to the invention, by means of an amplifier 4 equipped with a current slaving loop common to the three double windings.

The two parts 1, 1', 2, 2' or 3, 3' of each of the three double windings are connected in series and their interconnection point taken to ground. Two current measurement resistors 5, 5', of low value, for example one Ohm, are interposed in series between the two parts of each of the double windings, on either side of the earth. They deliver, to the input of the current slaving loop, an alternating voltage proportional to the strength of the alternating excitation current actually passing through the double windings. The measurement amplifier 6 of the current slaving loop amplifies this measurement voltage and applies it to the amplifier 4 which compares it with an input datum alternating voltage Ve and adapts the amplitude of its alternating output voltage in order to cancel out the error between measurement voltage and datum voltage, and to act so that the alternating excitation current keeps a constant strength in the double windings.

The multiplexer interconnecting the three double windings, 1, 1', 2, 2', and 3, 3' to the output of the amplifier 4 includes three transformers 7, 8 and 9, as many as there are double windings, each provided with a primary winding 71, 81, 91 with intermediate tappings, with a secondary winding 72 with intermediate tappings and with a short-circuiting winding 73.

The three primary windings 71, 81, 91 of the transformers 7, 8 and 9 are connected in series, via a tuning capacitor 10, between the output of the amplifier 4 and ground.

The secondary winding 72 of the first transformer 7 is connected to the terminals of the first double winding 1, 1' of the triple antenna, while the secondary winding of the second transformer 8 is connected to the terminals of the second double winding 2, 2' of the triple antenna and the secondary winding of the third transformer 9 is connected to the terminals of the third double winding 3, 3' of the triple antenna.

The three auxiliary short-circuiting windings 73 of the transformers 7, 8, 9 are closed by a first bank of three switches controlled by a control circuit 40. Each of these switches is formed by two field-effect transistors 74, 75 interconnected by their source electrodes placed at ground potential. The drain-source junctions of these field-effect transistors 74, 75 are placed in series and in opposition at the terminals of the auxiliary short-circuiting winding so as to allow the blocking of the two current half-cycles. Their gate electrodes are connected in parallel and receive, from the control circuit 40, a blockage or saturation control voltage C1, C2, C3. This control voltage is a gate-source bias voltage which is not floating with respect to earth due to the fact that the transistors have their source electrode at earth potential, which is made possible by the isolation of the auxiliary short-circuiting winding with respect to the other primary and secondary windings of each transformer.

A second bank of three controlled switches allows the secondary circuits of the three transformers 7, 8, 9 to be opened in order to reduce the leakage currents. Each controlled switch of this second bank is formed by two field-effect transistors 11, 12; 21, 22; 31, 32 interposed in series between the two parts 1, 1'; 2, 2'; 3, 3' of a double winding of the triple antenna, on either side of the measurement resistors 5, 5'. The source electrodes of these field-effect transistors are connected to earth via the measurement resistors 5, 5' and are thus at a low potential with respect to earth. Their drain-source junctions are then placed in series and in opposition in the secondary circuit of a transformer, which allows the blocking of the two half-cycles of the current. Their gate electrodes are connected in parallel and receive, from the control circuit 40, a blocking or saturation control voltage. As the field-effect transistors 11, 12; 21, 22; 31, 33 have their source electrode at a potential close to earth, this control voltage is a gate-source bias voltage which is not floating with respect to ground which, conveniently, takes the same values as the control voltage of the transistors of the first bank of switches. More precisely, the control voltages of the field-effect transistors 11, 12; 21, 22; 31, 32 of this second bank of switches take values C1, C2, C3 opposite to those applied to the field-effect transistors of the first bank of switches so that the switches of the second bank take states opposite to those of the first bank.

It can be envisaged, in the case in which the current slaving loop is not indispensable, to omit it and to replace the measurement resistors 5, 5' by conducting bridges. The field-effect transistors of the controlled switches of the second bank will then all be connected to ground by their source electrode.

In normal operation, the control circuit 40 gives rise to the blocking, each in turn, of one of the three switches of the first bank enclosing the auxiliary, short-circuiting windings of the three transformers 7, 8 and 9, the conduction of the other two switches of the first bank and the placing of the switches of the second bank into opposite conduction states. The two transformers which have their short-circuiting winding closed by a switch of the first bank in conduction saturate. They reflect very low impedances at their primary and secondary. It results therefrom that the double windings of the triple antenna would be practically in short-circuit if they were not opened by the corresponding switches of the second bank. Moreover, a negligible voltage drop is produced at their primary transferring the majority of the alternating excitation voltage seen at the output of the amplifier 4 by the tuning capacitor 10 to the terminals of the primary of the third transformer whose auxiliary short-circuiting winding is opened by a turned-off switch. As, moreover, this third transformer has its secondary circuit closed at the terminals of a double winding of the triple antenna by means of a switch of the second bank in the conducting state, it delivers to this double winding an alternating excitation current which keeps a constant strength under the action of the current slaving loop.

The use of a primary' winding with intermediate tappings for each transformer gives the possibility of impedance matching. It is thus possible, by a judicious choice of the tappings by which the primary windings of the transformers are driven, to make it such that the double windings, although of different impedances, reflect identical impedances to the primaries of the transformers when the latter are not saturated.

Figure 2:
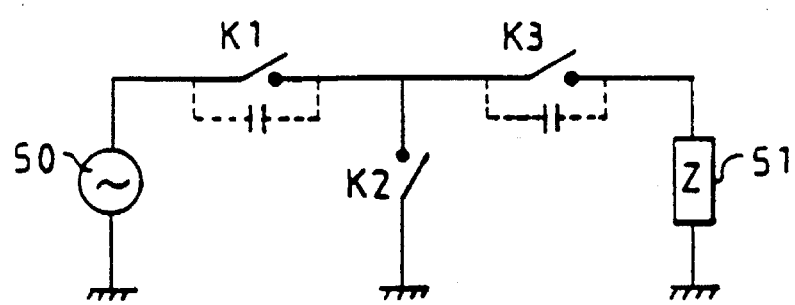
FIG. 2 represents a skeleton diagramme of a T switch making it possible to connect or to disconnect a load and a source while, by comparison with a simple switch, improving the isolation of the load with respect to the source when it is in the open state.

The use of the two banks of controlled switches in order, at the same time, to short-circuit the extremities of the non-excited double windings of the triple antenna and to open them at a mid point allows a much better cancellation of the currents which pass through them to be obtained. In effect, the switches of the two banks behave, for each winding, like the mounting of switches in a T of FIG. 2 which exhibits, between a source 50 of alternating electrical energy and a load 51, two switches in series K1 and K3, operated in synchronism and completed by a third switch K2 which links the earth to their mid point and which is operated in opposition. Such a mounting makes it possible, as is well known, to reduce the effects of the parasitic capacitance presented by the field-effect transistors used for the switches since, when the load is isolated from the source by the opening of the switches K1, K3 and by the closing of the switch K2, there is, upstream of the switch K3 in series with the load, only a very small portion of the voltage from the source. The switch of the first bank which is placed at the terminals of the auxiliary, short-circuiting winding of a transformer and controls the saturation of the latter, plays the part of the switches K1, K2 while the switch of the second bank interposed in series with the load plays the part of the switch K3.

The use of transformers between the output of the amplifier 4 and the double windings 1, 1'; 2, 2'; 3, 3' of the triple antenna makes it possible to obtain a first voltage gain by acting on the ratio between primary and secondary windings. This first voltage gain is completed by a second voltage gain resulting from the placing of the inductive load of the amplifier 4 into resonance by means of the linking capacitor 10, this complement being a function of the overvoltage factor of the oscillating circuit obtained which may reach four or five.

As can be seen in FIG. 1, the intermediate tappings of the secondary winding of each transformer are connected to one of the extremities of a double winding of the triple antenna by means of a selector 76 which makes it possible to change the tuning frequency of the load of the amplifier 4 by changing the self inductance seen at the primary of the transformer. It may, in fact, be useful, in the case in question of an electromagnetic system for locating the position and the orientation of an object at short range, to modify the operating frequency in order to get away from another electromagnetic locating system operating in the vicinity at the same frequency.

Figure 3:
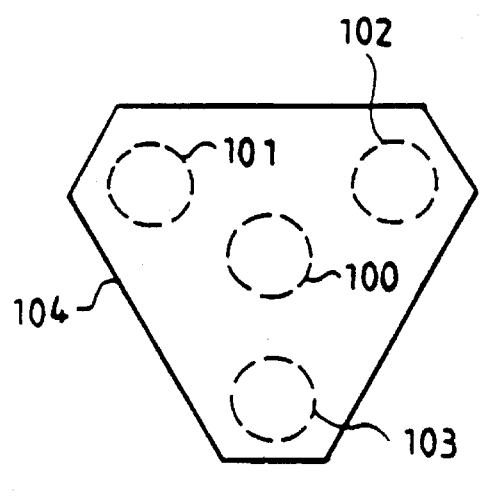
FIGS. 3 and 4 illustrates, seen from above and seen from the side, the magnetic circuit with several parallel legs of a single transformer which can be used for the means of coupling by electromagnetic flux.
Figure 4:
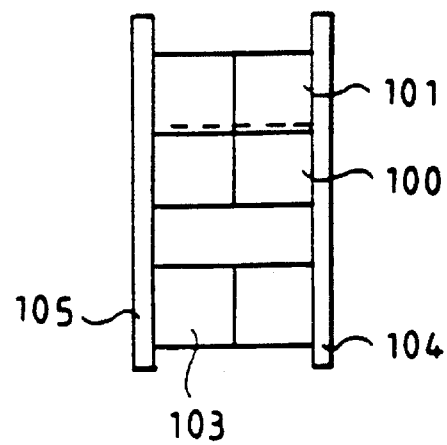

The three transformers 7, 8 and 9 used in the diagram of FIG. 1 may be replaced by a single transformer with a single primary winding which it makes it possible to reduce the ohmic losses in the primary circuit. The single transformer then exhibits a magnetic circuit with four parallel legs around which are distributed the coils. This magnetic circuit may be produced, as represented in FIGS. 3 and 4 with the aid of four pillars or legs 100, 101, 102, 103 of the same length held between two plane yokes 104, 105 of triangular profile. The central leg 100 receives the single primary winding while each peripheral leg 101, 102, 103 receives a secondary winding and an auxiliary, short-circuiting winding.

The magnetic flux generated by the primary winding in the central leg 100 of the magnetic circuit is closed by the yokes 104 and 105 and by the single peripheral leg 101, 102 or 103 which does not have its auxiliary winding in short-circuit, so that only the secondary winding of this peripheral leg is coupled to the primary winding which carries out the multiplexing function.

Figure 5:
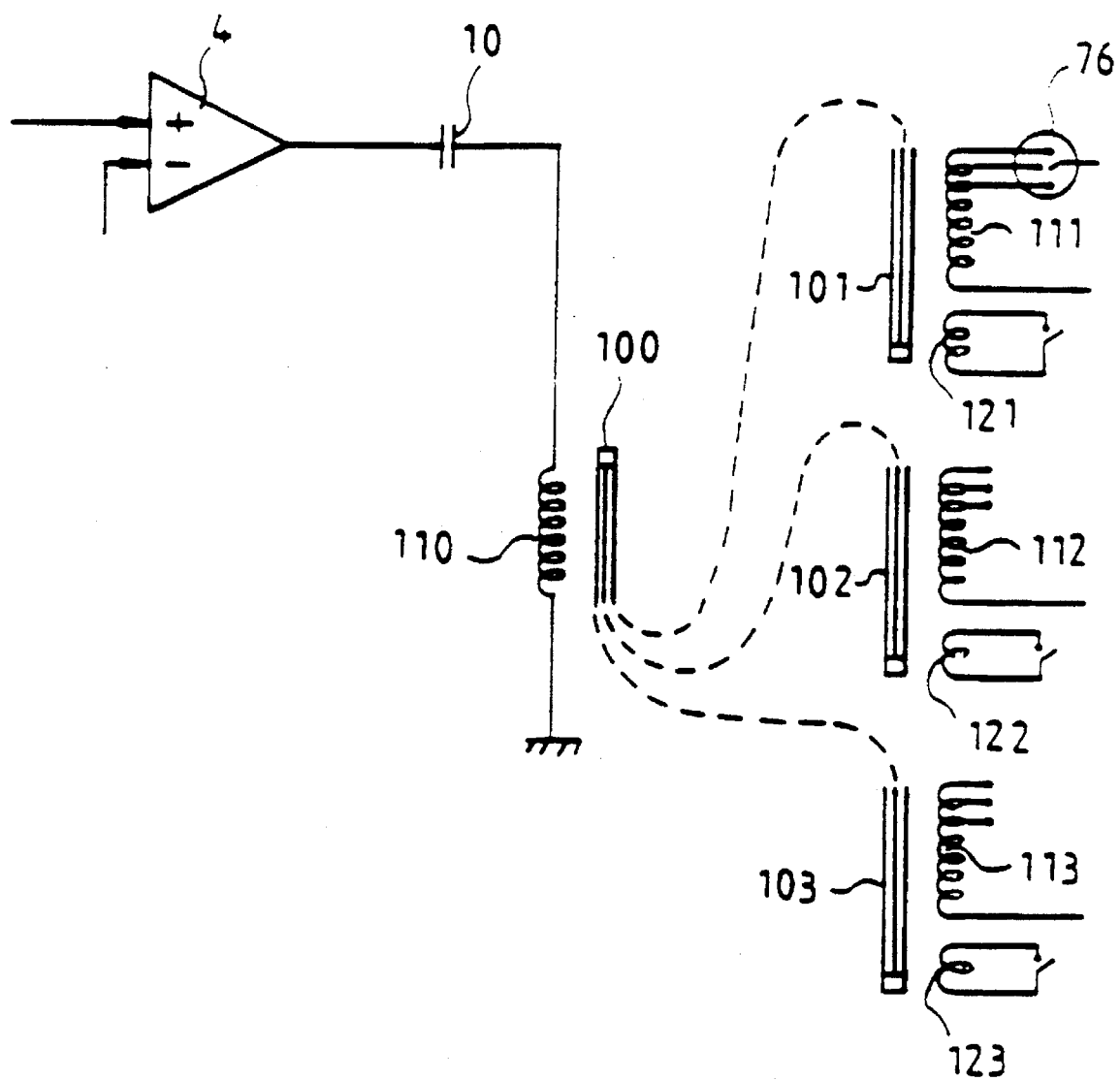
FIG. 5 shows the modification of the electrical diagram of FIG. 1 entailed by the use of the single transformer, the magnetic circuit of which is shown in FIGS. 3 and 4.

The partial diagram of FIG. 5 shows the modifications which result for the diagram of FIG. 1 from the use of a single transformer with a magnetic circuit with several parallel legs.

The output of the amplifier 4 is now connected by the use of the tuning capacitor 10 to the single primary winding 110 coiled round the central leg 100 of the transformer. The secondary windings 111, 112 and 113 respectively each coiled round a peripheral leg 101, 102 and 103 respectively of the transformer with an auxiliary winding 121, 122 and 123 respectively are connected, as before, to the extremities of the three double windings of the triple antenna via a selector 76 making it possible to change the tuning frequency of the load of the amplifier 4.

The counter-balance related to the singleness of the primary is the necessity of using secondary windings with different numbers of turns for balancing the impedances in the case in which the loads exhibit different impedances. With this aim, it is possible to make provision to equip the two extremities of each secondary winding with a set of intermediate tappings, one intended for the selector making it possible to change the tuning frequency and the other intended for balancing the impedances of the different loads.

It is possible without departing from the context of the invention, to modify certain arrangements or replace certain means by equivalent means. Thus, in particular, in the case of the embodiment with several separate transformers, one per load, it is possible, in order to suppress coupling by magnetic flux, not to short-circuit an auxiliary winding but to cause a direct current of sufficient strength to saturate the magnetic path to pass through it.

We claim:

1. Electronic device for multiplexing loads to the terminals of a source of alternating electrical energy, characterized in that said electronic device includes:

means for coupling the source of alternating electrical energy by electromagnetic flux to the loads including at least one primary excitation winding connected to the terminals of the source of alternating electrical energy, and secondary windings , equal in number to that of the loads, at least partially coupled the primary winding and each connected to the terminals of a load means of inhibiting the means of coupling by electromagnetic flux including auxiliary windings, equal in number to that of the loads, each totally coupled with a secondary winding; and means for control of the inhibition means imposing the inhibition of all the magnetic couplings except one, which changes depending on the load to be coupled to the source of alternating electrical energy.

2. Device according to claim 1, characterized in that the means of coupling by electromagnetic flux windings as loads connected in series to the terminals of the source of alternating electrical energy and each totally coupled with a secondary winding (73) and an auxiliary winding (73) within an individual transformer.

3. Device according to claim 1, characterized in that the means of coupling by electromagnetic flux include a single primary excitation winding partially coupled to the various secondary windings within a single transformer having a magnetic circuit with several parallel legs with a first leg around which is wound the primary excitation winding and other legs around each of which are wound a secondary winding and an auxiliary winding.

4. Device according to claim 1, characterized in that the inhibition means include short-circuiting switch means (75) which each closed one of the auxiliary windings and which are controlled by the control means which impose an open state on one of them and a closed state on all the others, the first short-circuiting switch means in the open state changing depending on the load to be coupled to the source of alternating electrical energy.

5. Device according to claim 2, characterized in that the inhibition means include controllable sources of direct electrical current which each inject a direct electrical current into one of the auxiliary windings bringing about a saturation of the magnetic flux in the secondary winding corresponding to it by coupling, and which are controlled by the control means which block only one of them chosen on the basis of the load to be coupled to the source of alternating electrical energy.

6. Device according to claim 1, characterized in that it further includes isolating switch means equal in number to the loads each interposed in series between a load and the secondary winding to which it is connected, the said control means imposing a closed state on the isolating switch means arranged in series with the load whose means of coupling by electromagnetic flux with the source of alternating electrical energy is not inhibited and an open state on all the other isolating switch means.

7. Device according to claim 1, interconnected with inductive loads tuned with the aid of a capacitor arranged in series with the source of alternating electrical energy, characterized in that the secondary windings include adjustment tappings linked to a selector allowing the tuning frequency to be varied.

8. Device according to claim 2, interconnected with loads of different impedances, characterized in that the primary windings of the transformers include intermediate adjustment tappings the use of which allows equalization of the impedances presented by the loads to the source of alternating electrical energy.

9. Device according to claim 4, characterized in that each short-circuiting switch means includes two field-effect transistors interconnected by their source electrode taken to earth with their drain-source junctions placed in series and in opposition at the terminals of an auxiliary winding and their gate electrodes connected in parallel and biased by the control means.

10. Device according to claim 6, interconnected between loads with mid point taken to earth, characterized in that each isolating switch means includes two switches interposed in series in a load on either side of the mid point.

11. Device according to claim 6, interconnected between loads with mid point taken to earth and a source of alternating electrical energy provided with a current slaving loop measuring the current flowing in the loads on the basis of the voltage developed at the terminals of two measurement resistors interposed on either side of the earthing mid point, characterized in that each isolating switch means includes two switches interposed in series in a load on either side of the measurement resistors.

12. Device according to claim 10, characterized in that each isolating switch means includes two field-effect effect transistors interposed in a load on either side of its earthed mid point, with their source electrodes interconnected to the said mid point, their drain-source junctions placed in series and in opposition interconnecting the two parts of a load and their gate electrodes connected in parallel and biased by the control means.

13. Device according to claim 11, characterized in that each isolating switch means includes two field-effect transistors interposed in a load on either side of the measurement resistors, with their source electrodes interconnected to the measurement resistors, their drain-source junctions in series and in opposition interconnecting the two parts of a load to the measurement resistors, and their gate electrodes connected ill parallel and biased by the control means.

* * * * *